US006477602B1

(12) United States Patent
Loison

(10) Patent No.: US 6,477,602 B1
(45) Date of Patent: Nov. 5, 2002

(54) METHOD AND CIRCUIT FOR DETECTING THE PRESENCE OF A CONNECTOR IN A SOCKET

(75) Inventor: François Loison, Grenoble (FR)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/327,263

(22) Filed: Jun. 7, 1999

(30) Foreign Application Priority Data

Jun. 8, 1998 (EP) .............................. 98401426

(51) Int. Cl.[7] .......................... G06F 13/00; G06F 3/00; G06F 1/26
(52) U.S. Cl. ........................ 710/301; 710/17; 710/18; 713/323
(58) Field of Search ................................. 713/300, 320, 713/323, 340; 710/300, 303, 17, 18, 301 302, 304

(56) References Cited

U.S. PATENT DOCUMENTS 5,862,393 A * 1/1999 Davis ......................... 713/300
5,870,571 A   2/1999 Duburcq et al.
5,938,771 A * 8/1999 Williams et al. ............ 713/310
6,274,949 B1 * 8/2001 Lioux et al. .................. 307/64

FOREIGN PATENT DOCUMENTS

DE    4243348 A1   12/1992
GB    2203560 A    4/1988

OTHER PUBLICATIONS

IBM Technical Disclosure Bulletin, Nov. 1997, pp. 99–100, "Wake on Smartcard".
European Search Report, EP 98 40 1426, Oct. 22, 1998.

* cited by examiner

Primary Examiner—Peter Wong
Assistant Examiner—Tim Vo

(57) ABSTRACT

The invention relates to the detection of the presence of a connector in a socket (10), the connector keeping a pin (13) of the socket to a a given level. The invention suggests to take advantage of this for detecting the presence of the connector, by trying to pull the pin to another-level (20, 21), and determining whether the level on the pin is the given level or the other level.

For a socket for a WOL connector in the motherboard of a computer, the pin used is the wake signal pin, which is normally at a low level. Pull-up means are used to try and pull-up the voltage at the pin. This voltage is measured by scanning the status bit of the event register of the controller, to which the pin is connected. The voltage is pulled up only if no connector is plugged into the socket.

12 Claims, 1 Drawing Sheet

METHOD AND CIRCUIT FOR DETECTING THE PRESENCE OF A CONNECTOR IN A SOCKET

FIELD OF THE INVENTION

The invention relates to the field of computers, and more specifically to detection of the presence of a connector plugged into a socket. It applies especially, but not exclusively, to detecting the presence of Wake on Lan type connectors (hereinafter referred to as WOL connectors) plugged into the WOL socket of a computer motherboard. (Wake On Lan is a trademark of IBM Corporation)

BACKGROUND OF THE INVENTION

Power management, and essentially power saving is becoming an important concern for computer manufacturers, inter alia for environmental reasons. It is also a concern for battery-operated computers such as laptop computers. Another concern regarding computers is the remote management of the computers through local area networks or wide area networks. This concern is becoming important as the number of networked computers increases.

FIG. 1 is a representation of the state machine of a computer of the type currently sold by the applicant under the reference HP Vectra VL8. As shown on this figure, the computer may be in five different states. In the first one 1, the computer is off and unplugged, and the power consumption is nil; in a second state 2, the computer is OFF; in this state, the power supply unit is connected to the power supply, and the computer is off. However, the LAN card of the computer is in a sleep mode, that is the LAN is not available, however, the LAN is always powered and the LAN processor in the LAN card scans networks frames. In this state, pursuant to the German Ecolabel, the power consumption of the computer should be less than 5 W. The third state is the ON state, with the computer working; power consumption is then unlimited. The fourth state 4 is the sleep mode, where the functionalities of the computer are degraded; in this state, the power supply unit is on, and the computer as well as its LAN card are in a sleep mode. In this fourth state, pursuant to the recommendations of the US Energy Protection Agency, the power consumption should be less than 30 W. The fifth state 5 is a state where the computer is plugged and off; this state is entered when there is a power failure while the computer is connected to the wall.

The computer passes from the second state to the third one, as symbolised by arrow 6 when the ON/OFF button of the computer is activated to switch the computer on. As symbolised by arrow 7, the computer passes from the fourth state—sleep mode—to the third state—ON—when the computer is woken up. This may for instance be the case when the user presses a key on the keyboard of the computer.

For computers connected to a network, it has been suggested to allow both operations to be conducted from the LAN. The corresponding functions—Remote Power-on or RPO and Remote wake-up or RWU, respectively—are implemented on the computers sold by the applicant with the Hewlett-Packard NightDirector features. Remote power-on is the ability to power-on a PC remotely, from the OFF state; remote wake-up is the ability to wake-up a PC from energy saving sleep mode. These functions enable remote management applications to be carried out on remote computers. They involve sending a wake-up or power-on frame on the network; this frame is received and interpreted by the LAN card of the computer.

One LAN card allowing RPO and RWU is the PRO/100 LAN card sold by Intel which includes Wake on Lan capability. For wake-up or remote power-on of the computer, there is provided a WOL connector from the LAN card to the motherboard of the computer. The WOL connector comprises three pins: ground and power (Vccaux) pins, and one pin for a wake signal. Other manufacturers have the same or similar connectors for providing power from the motherboard, for instance Hewlett-Packard provides on some of its personal computers a NightDirector connector that comprises 5 RPO/RWU related pins, that is ground and power (Vccaux) pins, together with a power on pin, a wake-up pin and a RPO enable pin.

A PC motherboard may comprise more than one socket to accommodate different types of connectors. In the following the term WOL connector will be used to refer both to the Wake on Lan connector (and socket) available from IBM or Intel and to similar connectors or sockets incorporated in the products of other manufacturers.

In the second and fourth states of the state machine of FIG. 1, the power supply unit of the computer is switched off, and the main power supply Vcc of the computer is down. However, the auxiliary power supply Vaux or Vtrickle is available; this auxiliary power supply is used to power the LAN card, through the WOL socket, or through the HP NightDirector socket. Thus, the LAN card may process incoming frames, and the controller may wake-up or power-on the computer.

If a computer comprises more than one LAN cards, and if both cards enable RPO and RWU, more than one motherboard socket—for instance the WOL socket and the HP NightDirector socket—may be provided. In this case, the power supply to the auxiliary power supply may not be sufficient for powering each of the cards. Indeed, due to limitations on the power consumption in the sleep states, the available current on Vaux is usually limited to 700 mA. This problem is explained for instance in the user manual or in the Bios setup of computers sold by the applicant under the reference HP VECTRA VL8. The same problem also exists for any other specification using Vccaux; this is for instance the case for PCI 2.2.

The invention provides a solution to this problem. It ensures that the power consumption of the LAN cards in the computer in the sleep state will remain below the available power.

More generally, the invention provides a solution to the problem of detecting the presence of a WOL connector in a computer. Such a detection may also be useful for purpose other than power management in sleep states.

SUMMARY OF THE INVENTION

According to the invention, there is provided a method for detecting the presence of a connector in a socket, said connector keeping a pin of the socket to a a given level, comprising the steps of activating means for pulling said pin to another level;

determining whether the level on said pin is said given level or said another level; and detecting the presence of the connector when the level determined on said pin is said given level. In one embodiment of the invention, the means for pulling comprise a resistor and a switch connected in series between said pin and said another level, and the step of activating comprises closing said switch. Prefereably, the pin is wired to a register of a controller, and the step of determining comprises scanning said register. In another embodiment of the invention, the socket is in the motherboard of a computer, and is provided for receiving a connector to a local area network card. In this case, the pin may be a wake-up signal pin.

The invention also provides a method for disabling one of two sockets in a computer board, comprising the steps of:
determining the presence of a connector in one of said sockets, according to the method of one of claims 1 to 5; and
disabling the other of said sockets if a connector is present in said one socket. Preferably, said sockets are in the motherboard of a computer, and are each provided for receiving a connector to a local area network card.

Finally, the invention provides a computer board, comprising a socket for receiving a connector, means for temporarily pulling one pin of said socket to a level, and means for determining the level on said pin. Preferably, the means for temporarily pulling comprise a resistor and a switch connected in series between said pin and said a level. In another embodiment, the pin is wired to a register of a controller, and the means for determining comprises means for scanning said register. Preferably, the socket is in the motherboard of a computer, and is provided for receiving a connector to a local area network card. In another embodiment of the invention, the pin is a wake-up signal pin.

BRIEF DESCRIPTION OF THE INVENTION

A power management system embodying the invention will now be described, by way of non-limiting example, with reference to the accompanying drawings, in which FIG. 1 is a state machine of a prior art computer;

BEST MODE OF CARRYING OUT THE INVENTION

Figure 1:
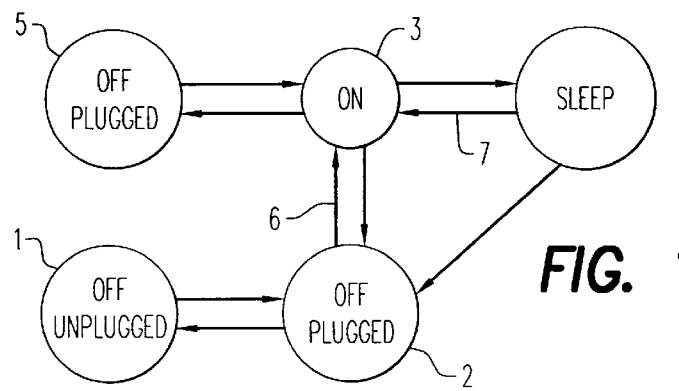
Figure 2:
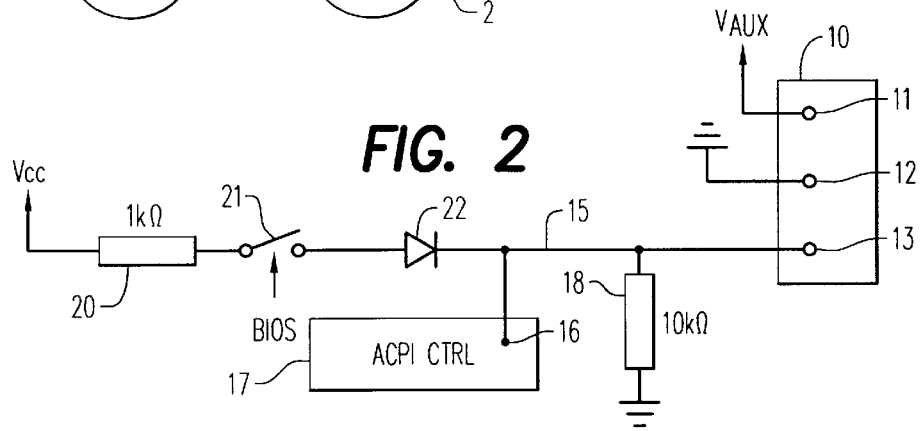
FIG. 2 is a schematic diagram of a circuit according to an embodiment of the invention.

FIG. 2 is a schematic diagram of a circuit according to one embodiment of the invention. The diagram of FIG. 2 shows the WOL socket 10 of the motherboard, with its Vaux, ground and wake pins 11, 12 and 13. The Vaux pin is wired to the Vaux plane, and the ground pin is wired to the ground plane. The wake signal pin is wired by wire 15 to one pin 16 of the controller 17, e.g. one pin of an Advanced Configuration and Power Interface (ACPI) controller, for setting the status bit of the wake-up event. ACPI is an open interface specification defined by Intel, Microsoft and Toshiba which specifies the power management interface between a computer operating system and the system hardware and software that enables the operating system to manage the power consumption of the computer. The ACPI 1.0 Specification available from Microsoft can be consulted for more details. In addition, wire 15 is connected to the ground through a resistor 18, usually a 10 kOhms resistor, that pulls down the wake pin.

The WOL socket does not comprise any pin that could be used for detecting the presence of a connected card. In order to allow detection of a connector plugged into the WOL socket, the invention proposes to provide a pull-up on the wire 15, having a lower resistance than that of the pull-down resistor 18. This pull-up is controlled by a switch. In the embodiment of FIG. 2, the wire 15 is connected to the main power supply Vcc through a resistor 20, a switch 21, and a diode 22. The resistor 20 has a resistance lower than the pull-down resistor 18, e. g. a resistance of 1 kOhm. The switch 21 is controlled by the Bios of the computer. Diode 22 ensures that the Vaux pin of the WOL connector sends no current to Vcc when the computer is off.

Figure 3:
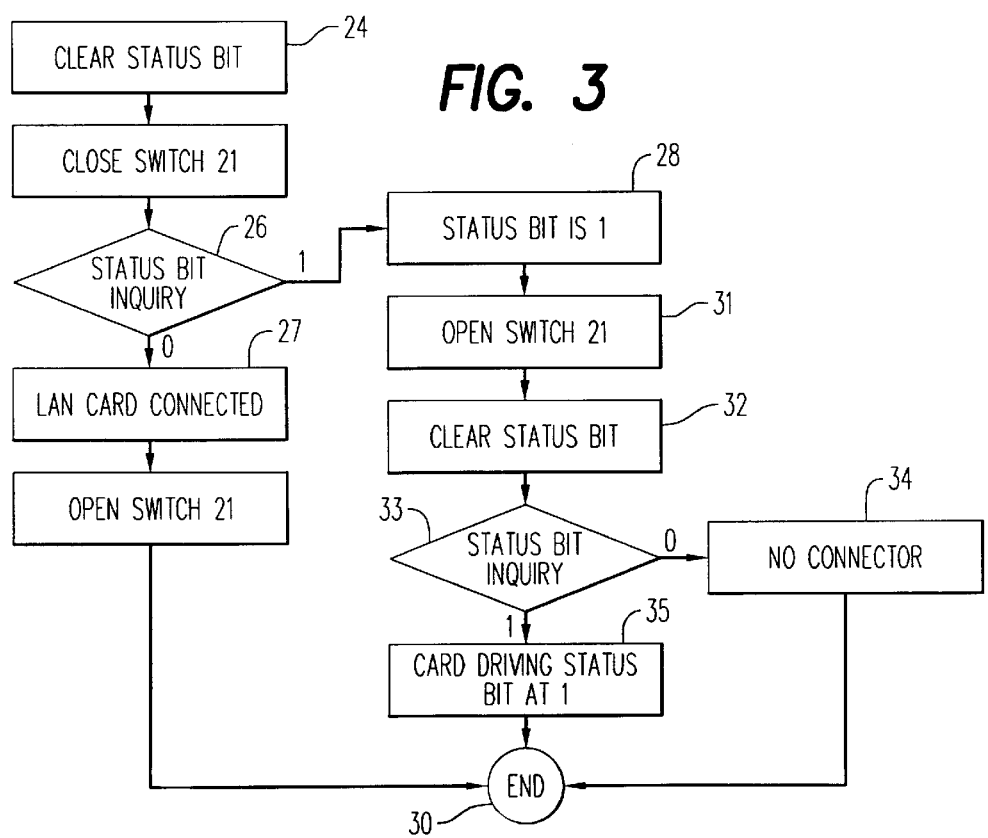
FIG. 3 is a flowchart of the operation of the circuit of FIG. 2.

The operation of the circuit of FIG. 2 is described in the flowchart of FIG. 3; it is carried out in a state where the power supply to the pull-up is provided. In a first step 24, the ACPI status bit is cleared; indeed, the ACPI status bits are 'sticky', that is they remain in the high level even if the event that generated them has disappeared. In order to detect the presence of a connector-plugged into the WOL socket, at step 25, the switch 21 is closed, under a command of the Bios, for a period of time sufficient to pull-up wire 15 where no connector-is plugged into the socket. For the exemplified values of resistance of the pull-up and pull-down resistors, a period of time of 1 ms is sufficient. At step 26, an inquiry on the status bit of the ACPI controller is conducted.

If the status bit is at a low level, step 27, the pull-up did not succeed in pulling the wake-up pin to the high level. This means that a LAN card is connected to the WOL socket, and that the buffer of the LAN card has kept the wake-up signal at a low level, notwithstanding the pull-up. It is then determined that a LAN card is connected to the WOL socket.

It the status bit is at a high level, step 28, it is determined that no connector is plugged into the socket, or that a connector plugged into the socket asserts a high level on the pin. Operation then passes to step 31; in this step, the switch 21 is opened, and then, at step 32, the status bit is again cleared. Thereafter, in step 33, another inquiry on the status bit of the ACPI controller is conducted. If the status bit is 0, step 34, it is determined that there is no connector plugged, and the operation is ended. Else, in step 35, if the status bit is at a high level, it is determined that a card is present, and drives the Vaux of the WOL connector to a high level. The process is then over.

After step 27, the pull-up switch is opened, step 29. Thereafter, step 30, the process according to the invention is over; it may be repeated at any time. It should be noted that the step of opening the switch may also be carried out at a different time, e. g. 1 ms or so before scannings the status bit.

Preferably, the step of inquiry of the value of the status bit s is conducted after a period of time that is short with respect to the time constant of the buffer and pull-up assembly; this ensures that the value of the status bit will be very near to the low level imposed by the buffer of the LAN card. The period of time is also preferably longer than the time constant of the wire and pull-up assembly; thus, if no LAN card is connected to the socket, the value of the status bit will reach the high level before it is scanned. A time period of 1 ms is appropriate.

This approach may be used as a solution to the above mentioned problem of powering of LAN cards in the sleep states of the computer. For this purpose, if the presence of a WOL connector plugged into the WOL socket is detected, the HP NightDirector socket is disabled, at least in the sleep states. This may be done by methods known per se to the person skilled in the art, e.g. using the Bios.

Indeed, both the HP NightDirector socket and a PCI 2.2 socket have the feature that they may be disabled, whereas the WOL socket may not be disabled. If the HP NightDirector socket is disabled when the presence of a WOL connector is detected it is ensured that the HP NightDirector socket will not be powered, and that the power consumption in the sleep states will stay below the authorised consumption.

The invention is not limited to the embodiments discussed above. It applies not only for disabling a HP NightDirector socket or a PCI 2.2 socket, but also for any purpose where the detection of the presence of a WOL connector in a WOL socket is necessary. More generally the same approach may be applied to the detection of a connector in a socket, when a pin is kept by the connector at a given level. It this case, the pull-up represents means for pulling the pin to the other level.

In addition, the invention has been described in relation to the preferred embodiment, where the WOL connector keeps the wake signal at a low level; however, the invention may be equally well carried out for detecting a connector that keeps a pin at a high level. In this case, the role of the ground and of the Vcc voltage will simply be exchanged.

The terms socket and connector are used throughout this specification to designate two mating parts. The term pin is used to designate one means of providing electrical connection in the socket or connector. The invention is unrelated to the nature and structure of the socket and connector assembly, and may be carried out for any type of such assembly; it is also unrelated to the way the pin of the socket and connector are put into contact. In this respect, the term "pin" is intended to cover any alternative contact portion in the connector, male or female.

What is claimed is:

1. A method for detecting a presence of a connector in a socket, said connector keeping a pin of the socket at one of a first or second level, said method comprising:

pulling said pin to said first level;

detecting the presence of the connector when, in response to pulling said pin to said first level, the level determined on said pin is said second level;

pulling said pin to said second level when, in response to pulling said pin to said first level, the level determined on said pin is said first level; and detecting the presence of the connector when, in response to pulling said pin to said second level, the level determined on said pin is said first level.

2. The method according to claim 1, wherein pulling said pin to said first level comprises closing a switch connected in series between said pin and a resistor connected to said first level, and wherein pulling said pin to said second level comprises opening said switch.

3. The method according to claim 1, wherein said pin is wired to a register of a controller, and wherein determining the level on said pin comprises scanning said register.

4. The method according to claim 1, wherein said socket is in the motherboard of a computer, and is provided for receiving a connector to a local area network card.

5. The method according to claim 4, wherein said pin is a wake-up signal pin.

6. A method for disabling one of two sockets in a computer board, comprising:

determining the presence of a connector in one of said sockets, said connector keeping a pin of said one of said sockets at one of a first or second level, by:

pulling said pin to said first level;

detecting the presence of the connector when, in response to pulling said pin to said first level, the level determined on said pin is said second level;

pulling said pin to said second level when, in response to pulling said pin to said first level, the level determined on said pin is said first level; and detecting the presence of the connector when in response to pulling said pin to said second level, the level determined on said pin is said first level; and disabling the other of said sockets in response to detecting the presence of the connector in said one socket.

7. The method according to claim 6, wherein said sockets are in the motherboard of a computer, and are each provided for receiving a connector to a local area network card.

8. A computer board, comprising:

a socket for receiving a connector, said connector keeping a pin of said socket at one of a first or second level;

circuitry for temporarily pulling said pin to said first level;

circuitry for detecting the presence of the connector when, in response to temporarily pulling said pin to said first level, the level determined on said pin is said second level;

circuitry for temporarily pulling said pin to said second level when, in response to pulling said pin to said first level, the level determined on said pin is said first level; and circuitry for detecting the presence of the connector when in response to pulling said pin to said second level, the level determined on said pin is said first level.

9. The computer board according to claim 8, wherein said circuitry for temporarily pulling said pin to said first level comprises a resistor and a switch connected in series between said pin and said first level.

10. The computer board according to claim 8, wherein said pin is wired to a register of a controller, and wherein determining the level on said pin comprises means for scanning said register.

11. The computer board according to claim 8, wherein said socket is in the motherboard of a computer, and is provided for receiving a connector to a local area network card.

12. The computer board according to claim 11, wherein said pin is a wake-up signal pin.

* * * * *